US010991741B2

(12) United States Patent
Tanaka et al.

(10) Patent No.: US 10,991,741 B2
(45) Date of Patent: Apr. 27, 2021

(54) PHOTOELECTRIC CONVERSION APPARATUS AND EQUIPMENT

(71) Applicant: CANON KABUSHIKI KAISHA, Tokyo (JP)

(72) Inventors: Yoshiei Tanaka, Hachioji (JP); Katsunori Hirota, Yamato (JP); Yusuke Onuki, Fujisawa (JP); Tsutomu Tange, Yokohama (JP); Takumi Ogino, Koganei (JP)

(73) Assignee: Canon Kabushiki Kaisha, Tokyo (JP)

( * ) Notice: Subject to any disclaimer, the term of this patent is extended or adjusted under 35 U.S.C. 154(b) by 68 days.

(21) Appl. No.: 16/556,964

(22) Filed: Aug. 30, 2019

(65) Prior Publication Data
US 2020/0083263 A1 Mar. 12, 2020

(30) Foreign Application Priority Data

Sep. 12, 2018 (JP) .............................. JP2018-170835

(51) Int. Cl.
H01L 27/146 (2006.01)
(52) U.S. Cl.
CPC .... H01L 27/1463 (2013.01); H01L 27/14603 (2013.01); H01L 27/14627 (2013.01); H01L 27/14683 (2013.01)
(58) Field of Classification Search
CPC ......... H01L 27/14603; H01L 27/14627; H01L 27/14683; H01L 27/1463
See application file for complete search history.

(56) References Cited

U.S. PATENT DOCUMENTS

| 10,861,894 B2* | 12/2020 | Wu ..................... H01L 27/1463 |
| 2010/0237451 A1* | 9/2010 | Murakoshi .......... H01L 27/1463 |
| | | 257/432 |
| 2014/0054662 A1 | 2/2014 | Yanagita |
| 2014/0285627 A1 | 9/2014 | Kuboi |
| 2016/0112614 A1 | 4/2016 | Masuda |
| 2017/0345853 A1 | 11/2017 | Kato |
| 2017/0366770 A1 | 12/2017 | Yokogawa |
| 2018/0219040 A1 | 8/2018 | Choi |
| 2018/0374903 A1 | 12/2018 | Otake |

FOREIGN PATENT DOCUMENTS

| JP | 2015-162562 A | 9/2015 |
| JP | 2016-31993 A | 3/2016 |
| WO | 17/154605 A1 | 9/2017 |
| WO | 2018/163838 A1 | 9/2018 |

* cited by examiner

Primary Examiner — Dale E Page
Assistant Examiner — Wilner Jean Baptiste
(74) Attorney, Agent, or Firm — Canon U.S.A., Inc. IP Division

(57) ABSTRACT

A silicon compound film that is any one of a silicon oxide film, a silicon nitride film, and a silicon carbide film, and a metal compound film lying between the silicon compound film and a semiconductor layer are arranged above a main face. The silicon compound film and the metal compound film extend into a first trench, and the metal compound film extends into a second trench. When a distance from the bottom of the second trench to the silicon compound film is expressed as "Hb", and a distance from the main face to the silicon compound film is expressed as "Hd", the respective distances satisfy the condition "Hd<Hb".

20 Claims, 5 Drawing Sheets

PHOTOELECTRIC CONVERSION APPARATUS AND EQUIPMENT

BACKGROUND OF THE INVENTION

Field of the Invention

The present disclosure relates to an isolation portion arranged between photoelectric conversion portions.

Description of the Related Art

United States Patent Application Publication No. 2018/0219040 discusses an image sensor having fixed charge films (160, 1160) and antireflection films (170, 1170) arranged inside trenches (140,1140) provided on a portion close to the center of a sensing area.

In the technique described in United States Patent Application Publication No. 018/0219040, there are instances in which light is lost due to the trenches (140, 1140), so that sensitivity cannot be acquired sufficiently.

SUMMARY OF THE INVENTION

The present disclosure is directed to a photoelectric conversion apparatus having improved sensitivity. According to an aspect of the present disclosure, a photoelectric conversion apparatus includes a semiconductor layer including a plurality of photoelectric conversion portions and a main face forming respective light receiving faces of the plurality of photoelectric conversion portions. The plurality of photoelectric conversion portions includes a first photoelectric conversion portion, a second photoelectric conversion portion and a third photoelectric conversion portion. The semiconductor layer has a first trench positioned between the first photoelectric conversion portion and the second photoelectric conversion portion, a second trench positioned between the second photoelectric conversion portion and the third photoelectric conversion portion. The first trench and the second trench each continuously extend on the main face. A silicon compound film that is any one of a silicon oxide film, a silicon nitride film, and a silicon carbide film and a metal compound film lying between the silicon compound film and the semiconductor layer are provided above the main face. The silicon compound film and the metal compound film extend into the first trench. The metal compound film extends into the second trench. The following conditions are satisfied:

Hd<Hb; and

Wa−2×Hd>Wb, where a distance from a bottom of the second trench to the silicon compound film is expressed as Hb, a distance from the main face to the silicon compound film is expressed as Hd, a width of the first trench is expressed as Wa, and a width of the second trench is expressed as Wb.

Further features of the present disclosure will become apparent from the following description of exemplary embodiments (with reference to the attached drawings).

DESCRIPTION OF THE EMBODIMENTS

Figure 1:
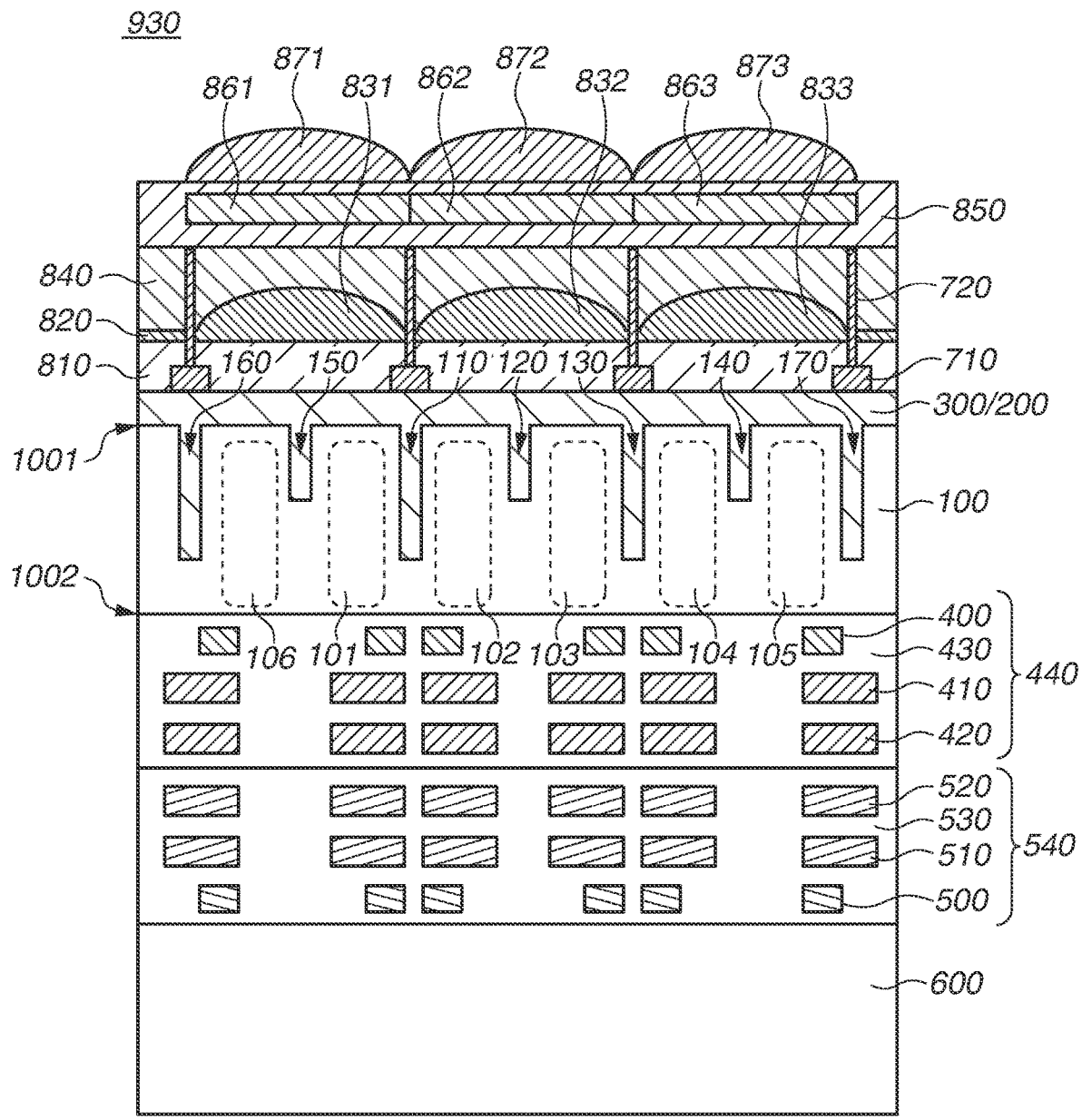
FIG. 1 is a schematic section diagram illustrating a photoelectric conversion apparatus.

Hereinafter, an exemplary embodiment embodying the present disclosure will be described with reference to the accompanying drawings. According to the present disclosure, it is possible to provide an advantageous technique for improving the sensitivity of a photoelectric conversion apparatus. In the below-described exemplary embodiments or drawings, common reference numerals are applied to configurations common to each other in the plurality of drawings. Thus, the common configuration will be described with cross-reference to the plurality of drawings, and description of the configurations having the common reference numerals will be omitted as appropriate. The configurations having similar names with different reference numerals may be distinguished from one another by "n-th" being added thereto as appropriate, e.g., the first configuration, the second configuration, and the third configuration.

FIG. 1 is a section diagram illustrating a photoelectric conversion area (imaging area) of a photoelectric conversion apparatus 930. The photoelectric conversion apparatus 930 includes a semiconductor layer 100 having a plurality of photoelectric conversion portions 101, 102, 103, 104, 105, and 106. The semiconductor layer 100 is a monocrystalline silicon layer having a thickness of 1 to 10 μm, or a thickness of 2 to 5 μm, desirably. The semiconductor layer 100 has a back face 1001 that constitutes respective light receiving faces of the plurality of photoelectric conversion portions 101, 102, 103, 104, 105, and 106. Each of the photoelectric conversion portions 101, 102, 103, 104, 105, and 106 may be a photodiode. The back face 1001 serves as one of the two main faces of the semiconductor layer 100, and the semiconductor layer 100 has a front face 1002 serving as the other one of the two main faces thereof. A transistor including a gate electrode 400 is arranged on the front face 1002, and a wiring structure 440 including a plurality of wiring layers 410 and 420 and an interlayer insulation film 430 is arranged on the front face 1002. The transistor including the gate electrode 400 includes a transfer transistor, an amplification transistor, a reset transistor, and a selection transistor, and a pixel circuit is configured of these transistors.

In this example case, the photoelectric conversion portions 101, 102, 103, and 104 of the plurality of photoelectric conversion portions 101 to 106 are arranged in such a manner that the photoelectric conversion portions 102 and 103 are arranged between the photoelectric conversion portions 101 and 104. In another case, the plurality of photoelectric conversion portions 101 to 106 may not align in a straight line. In another case, a portion of a semiconductor layer (a semiconductor portion) that is other than a photoelectric conversion portion may be interposed between two of the plurality of photoelectric conversion portions 101 to 106.

The photoelectric conversion apparatus 930 includes isolation portions 110, 120, 130, 140, 150, 160, and 170.

The isolation portion 110 is positioned between the photoelectric conversion portions 101 and 102, and the isolation portion 120 is positioned between the photoelectric conversion portions 102 and 103. The isolation portion 130 is positioned between the photoelectric conversion portions 103 and 104, and the isolation portion 140 is positioned between the photoelectric conversion portions 104 and 105. The isolation portion 150 is positioned between the photoelectric conversion portions 101 and 106. The isolation portion 160 is positioned between a peripheral area of the photoelectric conversion apparatus 930 and the photoelectric conversion portion 106, and the isolation portion 170 is positioned between a peripheral area of the photoelectric conversion apparatus 930 and the photoelectric conversion portion 105.

Figure 2:
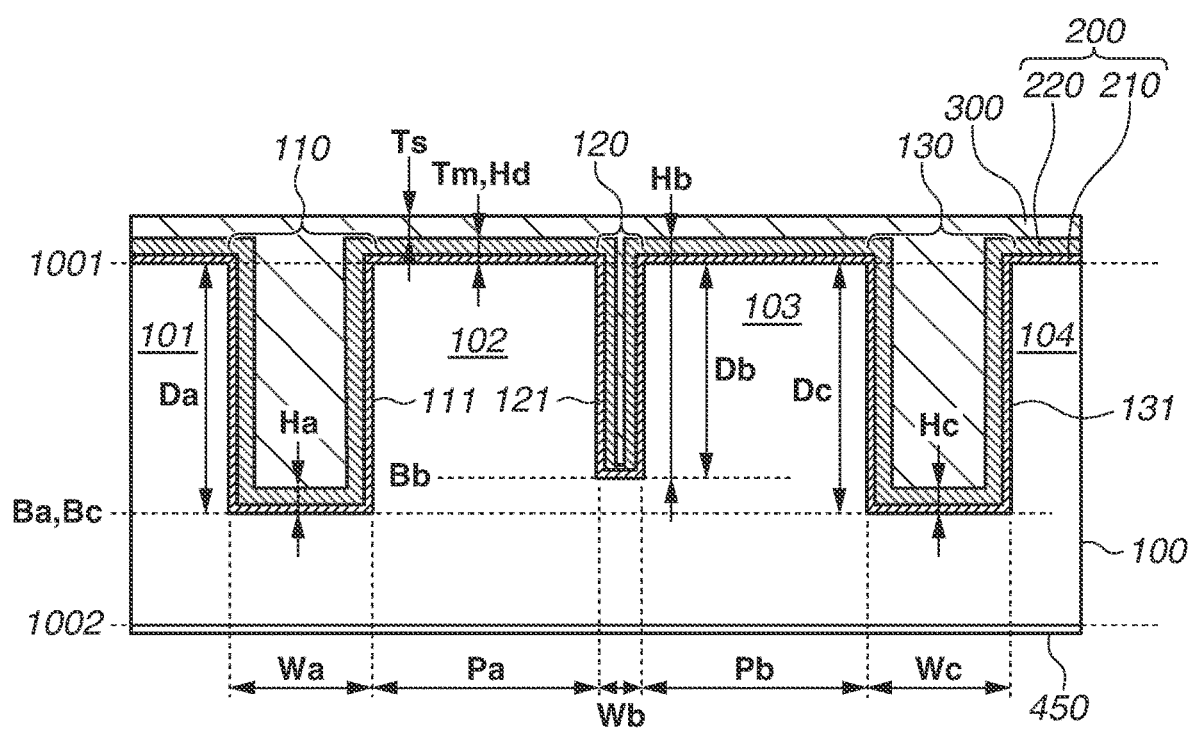
FIG. 2 is a schematic section diagram illustrating the photoelectric conversion apparatus.

FIG. 2 is an enlarged diagram of a portion including the isolation portions 110, 120, and 130 of the photoelectric conversion apparatus 930 illustrated in FIG. 1. A description will be provided below with cross-reference to FIGS. 1 and 2. In addition, configurations of the isolation portions 140 and 150 may be similar to the configuration of the isolation portion 120, and configurations of the isolation portions 160 and 170 may be similar to the configurations of the isolation portions 110 and 130, and thus the description thereof will he omitted.

The semiconductor layer 100 has trenches continuous to the back face 1001, and the isolation portions 110, 120, 130, 140, 150, 160, and 170 are provided inside the corresponding one of the trenches. A side face of each of the trenches and the back face 1001 are continuous, where the corresponding one of the isolation portions 110, 120, 130, 140, 150, 160, and 170 is arranged in each of the trenches.

As illustrated in FIG. 2, the isolation portion 110 is arranged inside a trench 111, the isolation portion 120 is arranged inside a trench 121, and the isolation portion 130 is arranged inside a trench 131. Each of the trenches 111, 121, and 131 extends toward the front face 1002 from the back face 1001. An insulation film 450 serving as a gate insulation film of the transistors and the interlayer insulation film 430 are arranged on the front face 1002.

The trench 111 forming the isolation portion 110 positioned between the photoelectric conversion portions 101 and 102 is positioned between the photoelectric conversion portions 101 and 102.

The trench 121 forming the isolation portion 120 positioned between the photoelectric conversion portions 102 and 103 is positioned between the photoelectric conversion portions 102 and 103.

The trench 131 forming the isolation portion 130 positioned between the photoelectric conversion portions 103 and 104 is positioned between the photoelectric conversion portions 103 and 104.

A silicon compound film 300 which is any one of a silicon oxide film, a silicon nitride film, and a silicon carbide film is arranged on the light receiving faces of the photoelectric conversion portions 101, 102., 103, 104, 105, and 106. The composition of the silicon compound film 300 can be expressed as "SiOxNyCz". Herein, any one of the letters x, y, and z represents a value greater than 0, and the another one of the letters x, y, and z represents a value not less than 0. The silicon compound film 300 can contain hydrogen (H), boron (B), fluorine (F), phosphorus (P), chlorine (Cl), and argon (Ar) addition to silicon (Si), oxygen (O), nitrogen (N), and carbon (C). The silicon compound film 300 is a silicon oxide film if x, y, and z satisfy the conditions of "x>0", "x≥y≥0", and "x≥z≥0". The silicon compound film 300 is a silicon nitride film if x, y, and z satisfy the conditions of "y>0", "y≥x≥0", and "y≥z≥0". The silicon compound film 300 is a silicon carbide film if x, y, and z satisfy the conditions of "z>0", "z≥x≥0", and "z≥y≥0". For example, a silicon oxynitride film (SiON film) can be classified into a silicon oxide film or a silicon nitride film depending on the amounts of O and N.

A metal compound film 200 positioned between the silicon compound film 300 and the semiconductor layer 100 is further arranged on the light receiving faces of the photoelectric conversion portions 101, 102, 103, 104, 105, and 106.

As illustrated in FIG. 1, each of the isolation portions 110, 120, 130, 140, 150, 160, and 170 includes at least one of the metal compound film 200 and the silicon compound film 300. As illustrated in FIG. 2, the silicon compound film 300 and the metal compound film 200 extend into the trench 111 to form the isolation portion 110. The metal compound film 200 extends into the trench 121 to form the isolation portion 120. The silicon compound film 300 and the metal compound film 200 extend into the trench 131 to form the isolation portion 130. In FIG. 1, the isolation portions 160 and 170 can be formed of both of the silicon compound film 300 and the metal compound film 200, and the isolation portions 140 and 150 can be formed of only the metal compound film 200. Alternatively, either the isolation portions 160 and 170 or the isolation portions 140 and 150 can be formed of only the metal compound film 200 or the silicon compound film 300.

A microlens array including the plurality of microlenses 871, 872, and 873 is arranged over the back face 1001. The microlens 871 out of the plurality of microlenses 871, 872, and 873 is arranged over the photoelectric conversion portions 101 and 106. The microlens 872 out of the plurality of microlenses 871, 872, and 873 is arranged over the photoelectric conversion portions 102 and 103. The microlens 873 out of the plurality of microlenses 871, 872, and 873 is arranged over the photoelectric conversion portions 104 and 105. Each of the microlenses 871, 872, and 873 is made of, for example, a resin.

Another lens array which is an interlayer lens array including a plurality of interlayer lenses 831, 832, and 833 is arranged between the microlens array including the plurality of microlenses 871, 872, and 873 and the semiconductor layer 100. Each of the interlayer lenses 831, 832, and 833 is arranged on a dielectric film 820, such as a silicon nitride film. In the present exemplary embodiment, upper convex lenses are used as the interlayer lenses 831, 832, and 833. Alternatively, the interlayer lenses 831, 832, and 833 may be lower convex lenses or biconvex lenses.

An insulation film 810, such as a silicon oxide film, is arranged between the interlayer lenses 831, 832, and 833, and the silicon compound film 300. An insulation film 840, such as a silicon oxide film, is arranged between the interlayer lenses 831, 832, and 833, and the microlenses 871, 872, and 873. With a difference between refractive indexes of the insulation film 840 and the interlayer lenses 831, 832, and 833 including the silicon nitride film, the interlayer lenses 831, 832, and 833 collect and condense light. A color filter array including color filters 861, 862, and 863 is arranged between the interlayer lenses 831, 832, and 833 and the microlenses 871, 872, and 873. For example, the color filter 861 is a red filter, the color filter 862 is a green filter, and the color filter 863 is a blue filter. A planarization film 850 is arranged between the color filters 861, 862, and 863 and the interlayer lenses 831, 832, and 833, and/or between the color filters 861, 862, and 863 and the microlenses 871, 872, and 873. For example, the planarization film 850 is made of a resin.

Light shielding members 710 are arranged between the insulation film 810, such as a silicon oxide film, and the silicon compound film 300. The light shielding members 710 may be each arranged to overlap with the corresponding one of the isolation portions 110, 130, 160, and 170. The light shielding members 710 may be arranged not to overlap with the isolation portions 120, 140, and 150. A light shielding wall 720 is arranged on each of the light shielding members 710. The light shielding wall 720 may be arranged to penetrate through at least one of the insulation film 810, the dielectric film 820, and the insulation film 840. The light shielding walls 720 may be arranged to surround the interlayer lens 831, 832, and 833.

An optical structure of a pixel is mainly defined by the microlens 872, the color filter 862, the interlayer lens 832, and the photoelectric conversion portions 102 and 103. However, some of the microlens 872, the color filter 862, and the interlayer lens 832 can be omitted. As described above, through the pixel structure in which a plurality of photoelectric conversion portions 102 and 103 is arranged on a single pixel, focus detection (auto-focusing), range-finding, expansion of a dynamic range, and encoding of a pixel signal can be feasible. The isolation portion 120 isolates a part of a pixel from the other part of the pixel, and each of the isolation portions 110 and 130 isolates a pixel from the other pixels. Herein, "isolate" refers to at least one of optical isolation and electrical isolation. The isolation portion 120 positioned inside a pixel is demanded to provide necessary and sufficient isolation performance while reducing issues arising from loss of light caused by existence of the isolation portion 120.

A semiconductor substrate 600 is stacked below the semiconductor layer 100. Transistors each including a gate electrode 500 are arranged on a surface of the semiconductor substrate 600. A wiring structure 540 is arranged on a surface of the semiconductor substrate 600, i.e., a position between the semiconductor substrate 600 and the wiring structure 440. The wiring structure 540 includes a plurality of wiring layers 510 and 520 and an interlayer insulation film 530. The transistor including the gate electrode 500 constitutes a driving circuit for driving a pixel circuit including the photoelectric conversion portion or a control circuit for controlling the photoelectric conversion apparatus 930. The transistor including the gate electrode 500 constitutes an analog-to-digital (AD) conversion circuit for executing AD conversion of an analog signal acquired from the pixel circuit. Furthermore, the transistor including the gate electrode 500 constitutes a digital signal processing circuit for processing a digital signal acquired through the AD conversion. The wiring structures 440 and 540 are electrically connected to each other through wiring that directly joins wiring layers, or through a via plug that penetrates the semiconductor layer 100. The wiring structures 440 and 540 may be electrically connected to each other through a bump between the wiring structures 440 and 540, or through wire bonding. In a case where the semiconductor substrate 600 is used as merely a supporting substrate, the transistor including the gate electrode 500 or the wiring structure 540 can be omitted.

The configurations of the isolation portions 110, 120, and 130 will be described below in detail with reference to FIG. 2. In FIG. 2, positions Ba and Bc represent the bottom positions of the trenches 111 and 131, and a position Bb represents a bottom position of the trench 121. A depth Da of the trench 111 corresponds to a distance between the back face 1001 and the position Ba, a depth Db of the trench 121 corresponds to a distance between the back face 1001 and the position Bb, and a depth Dc of the trench 131 corresponds to a distance between the back face 1001 and the position Be. In the present exemplary embodiment, the trench 121 is shallower than the trenches 111 and 131, and the relationship of the respective depths satisfies the conditions "Db<Da" and "Db<Dc". Although these conditions are suitable for exemplary embodiments, the conditions may be "Da≤Db" and "Da≤Dc". Each of the depths Da and Dc is 1 to 5 µm, and the depth Db is 1 to 3 µm, for example. In addition, any of the trenches 111, 121, and 131 may penetrate the semiconductor layer 100. In such a case, the depths Da, Db, and Dc of the trenches 111 121, and 131, respectively, which penetrate the semiconductor layer 100 each match the depth of the semiconductor layer 100. Further, the bottom positions Ba, Bb, and Bc of the trenches 111, 121, and 131 conform to the position of the front face 1002.

FIG. 2 further illustrates a distance Hb from the bottom (position Bb) of the trench 121 to the silicon compound film 300 and a distance Hd from the back face 1001 to the silicon compound film 300. FIG. 2 further illustrates a distance Ha from the bottom (position Ba) of the trench 111 to the silicon compound film 300 and a distance Hc from the bottom (position Bc) of the trench 131 to the silicon compound film 300.

Through a study conducted by the inventors of the present disclosure, it was found that the sensitivity of the photoelectric conversion portions 102 and 103 are improved by the average refractive index of the isolation portion 120 being increased as much as possible. In particular, it was found that sensitivity is remarkably improved with respect to light incident at an angle nearly vertical to the back face 1001 serving as a main face. When the isolation portions 110 and 130 is compared to the isolation portion 120, the ratio of the volume of the silicon compound film 300 to the volume of the metal compound film 200 inside each of the trenches 111, 121, and 131 is greater in the isolation portions 110 and 130 than in the isolation portion 120. In the present exemplary embodiment, the silicon compound film 300 does not exist inside the trench 121. Thus, this ratio can be zero with respect to the isolation portion 120.

The refractive index of the silicon compound film 300 is lower than that of the semiconductor layer 100 (i.e., silicon layer). Thus, the ratio of the silicon compound film 300 to the isolation portion 120 can be reduced as the distance Mb increases, so that the average refractive index of the inside of the isolation portion 120 can be increased. This is more suitable in a case where the refractive index of the silicon compound film 300 is lower than the refractive index of the metal compound film 200.

The sensitivity of the photoelectric conversion portions 102 and 103 can be improved as the distance Hb increases. The distance Hb is greater than the distance Hd (Hd<Hb), which is a characterizing feature. In the present exemplary embodiment, the distances Ha and Hc are equal to the distance Hd (Ha=Hd, Hc=Hd). Alternatively, the distances Ha and Hc may be greater than the distance Hd (Hd<Ha, Hd<Hc). It is also desirable that the distance Hb be greater than the distances Ha and Hc (Ha<Hb, Hc<Hb).

In order to make the distance Hb be different from the distances Ha and Hc, or to make the average refractive index of the isolation portion 120 be different from the average refractive indexes of the isolation portions 110 and 130, it is desirable that the number of layers forming the isolation portion 120 be different from the number of layers forming the respective isolation portions 110 and 130. Desirably, the number of layers forming the isolation portion 120 should be less than the number of layers forming the respective isolation portions 110 and 130. For example, the silicon compound film 300 arranged on each of the trenches 111 and 131 is not arranged on the trench 121 as described above. With this configuration, the number of layers forming each of the isolation portions 110 and 130 can decrease by the number of layers forming the isolation portion 120 and by the number of layers of the silicon compound film 300.

In a case where only one film from among a silicon oxide film, a silicon nitride film, and a silicon carbide film is arranged inside the trenches 111 and 131, the one film arranged may be regarded as the silicon compound film 300 for specifying the above-described distance In a case where two or more films from among a silicon oxide film, a silicon nitride film, and a silicon carbide film are arranged inside the trenches 111 and 131, any one of the arranged films can be regarded as the silicon compound film 300 for specifying the above-described distance Hb. In other words, the above-described distance Hb may be specified by, for example, the silicon oxide film being regarded as the silicon compound film 300 from among the silicon oxide film and the silicon nitride film arranged inside the trenches 111 and 131. Alternatively, the above-described distance Hb may be specified by, for example, the silicon nitride film being regarded as the silicon compound film 300 from among the silicon oxide film and the silicon nitride film arranged inside the trenches 111 and 131. One of the silicon oxide film and the silicon nitride film may be provided inside the trenches 111 and 131, and the other one of the silicon oxide film and the silicon nitride film may be arranged between the one of the silicon oxide film and the silicon nitride film and the metal compound film 200. In such a case, if one of the silicon oxide film and the silicon nitride film is regarded as the silicon compound film 300, the other one of the silicon oxide film and the silicon nitride film is provided between the silicon compound film 300 and the metal compound film 200.

A correlation between change of the distance Hb and change of the sensitivity becomes greater as the refractive index of the silicon compound film 300 becomes lower. More precisely, the correlation between change of the distance Hb and change of the sensitivity becomes greater as a difference between the refractive index of the semiconductor layer 100 and the refractive index of the silicon compound film 300 becomes greater. The refractive index of the silicon oxide film is approximately 1.4 to 1.6, the refractive index of the silicon nitride film is approximately 1.8 to 2.2, the refractive index of the silicon carbide film is approximately 2.2 to 2.8, and the refractive index of the silicon is approximately 3 to 7. Accordingly, a method for increasing the distance Hb by the silicon oxide film inside the trenches 111 and 131 being arranged as the silicon compound film 300 is particularly effective for improving the sensitivity.

In the present exemplary embodiment, the silicon compound film 300 is not positioned inside the trench 121. In other words, the distance Hb is greater than the depth Db of the trench 121 (Db<Hb) It is desirable that the distance fib satisfy the condition "Db<Hb", in such a way. This can be feasible if a film as an underlayer of the silicon compound film 300 underlayer film) is formed to completely cover trench 121. Desirably, the silicon compound film 300 should not exist on the lower half portion of the trench 121, and the distance fib should satisfy the condition "Db/2<Hb" even in a case where the silicon compound film 300 extends inside the trench 121.

In terms of improvement of the isolation performance of the isolation portions 110 and 130, the distances Ha and Hc should not be increased too much. As described above, the respective distances may satisfy the conditions "Ha<Hb" and "Hc<Hb". In the present exemplary embodiment, it is desirable that the respective depths satisfy the conditions "Db<Da" and "Db<Dc", and that the silicon compound film 300 extend into the trenches 111 and 131 to a position deeper than the position Bb of the bottom of the trench 121. If the relationship of the respective distances approximates "Ha=Hd" and "Hc=Hd", the depths of the silicon compound film 300 at the leading ends of the trenches 111 and 131 are expressed as "Da−Hd" and "Dc−Hd". It is desirable that the depth Db of the trench 121 be shallower than these depths (i.e., "Db<Da−Hd", "Db<Dc−Hd"). From this relationship, it is found that the conditions "Da−Db>Hd" and "Da−Db>Hd" are to be satisfied, desirably.

FIG. 2 further illustrates a distance Pa between the trenches 111 and 121, a distance Pb between the trenches 121 and 131, a width Wa of the trench 111, a width Wb of the trench 121, and a width Wc of the trench 131. The widths Wa and Wc are 200 to 800 nm, for example. The width Wb is 50 to 200 nm, for example.

Here, the widths Wa, Wb, and Wc of the trenches 111, 121, and 131 are constant in the depth direction of the trenches 111, 121, and 131. However, the widths Wa, Wb, and Wc do not have to be constant in the depth direction of the trenches 111, 121, and 131. For example, the widths Wa, Wb, and Wc may gradually decrease toward the bottoms thereof. Alternatively, in the back face 1001 corresponding to the inlet portions of the trenches 111, 121, and 131, the widths Wa, Wb, and Wc may be narrower than the widths of the other portions. In a case where a width of the trench is not constant in the depth direction, it is desirable that a position (reference position) in the depth direction which is used for defining the widths Wa, Wb, and Wc be common to the widths Wa, Wb, and Wc. A distance from the back face 1001 to the reference position is expressed as "Ds". The reference position can be determined to conform to the back face 1001 (i.e., Ds=0), for example. Alternatively, for example, each of the widths Wa, Wb, and Wc is desirably defined at a reference position at a depth of Db/2 from the back face 1001 (Ds=Db/2). In other words, if the depth Db is 2 μm, the widths Wa, Wb, and Wc of the trenches 111, 121, and 131, respectively, can be defined at a reference position corresponding to the depth of 1 μm from the back face 1001 (Ds=Db/2=1 μm). It is desirable that, at the reference position, the metal compound film 200 exist inside the trenches 111 and 131 on both side faces thereof, and the silicon compound film 300 exist such that the silicon compound film is sandwiched by the metal compound film 200 on both side faces. In other words, it is desirable that a position where both the metal compound film 200 and the silicon compound film 300 exist in the trenches 111 and 131 be set as the reference position. Typically,the distance Ds from the back face 1001 to the reference position as a position where both the metal compound film 200 and the silicon compound film 300 exist can be set within a range of "0≤Ds≤Db/2". In a case where a width of the trench is not constant in the depth direction, a maximum width in the depth direction of the respective trenches 111, 121, and 131 can be defined as the widths Wa, Wb, and Wc, respectively, which is another example of definition for the widths Wa, Wb, and Wc. Definitions for the widths Wa, Wb, and Wc other than definition based on the reference position and the maximum width are not suitable. For example, the relationship between the widths Wa, Wb, and Wc will not be suitable if the maximum widths of the trenches 111 and 131 are set as the widths Wa and Wc, whereas the minimum width of the trench 121 is set as the width Wb.

In order to sufficiently enhance the isolation performance of the isolation portions 110 and 130, the silicon compound film 300 desirably extends to a position at a depth deeper than half the depths Da and Dc of the trenches 111 and 131 (Da/2, Dc/2). It is desirable that the following conditions be satisfied in order to realize this configuration. Namely, a width made up by an intermediate film (e.g., metal compound film 200) between the silicon compound film 300 and the semiconductor layer 100 in each of the trenches 111 and 131 is "2×Hd", if the intermediate film having a thickness considered to be equal to the distance Rd is formed on both side faces of each of the trenches 111 and 131. Thus, the width of the portion other than the intermediate film in each of the trenches 111 and 131 is "Wa−2×Hd" and "Wc−2×Hd", respectively. The condition can be "2×Hd<Wa". However, if a difference between the widths "Wa" and "2×Hd" is small, the silicon compound film 300 cannot be suitably arranged inside the trenches 111, so that the isolation performance of the isolation portions 110 will not be sufficient. The same applies to width "Wc". Thus, the silicon compound film 300 can be suitably arranged in the isolation portion 120 if the widths of the portions other than the intermediate film in each of the trenches 111 and 131 is greater than the width Wb of the trench 121. In other words, it is only required that the conditions "Wa−2×Hd>Wb" and "Wc−2×Hd>Wb" are satisfied. These conditions can be transformed to "Wa−Wb>2×Hd" and "Wc−Wb>2×Hd". Accordingly, a difference between each of the trenches 111 and 131 and the trench 121 is greater than twice the distance Hd. It is desirable that the trench 121 is completely covered with the intermediate film. To that end, a width thereof satisfies the condition "Wb≤2×Hd", desirably.

Reducing the distance Hb is desirable in terms of improvement of the sensitivity, and reducing the depth Db of the trench 121 is efficient for reducing the distance Hb. Desirably, the depth Db of the trench 121 is smaller than a pixel size defined by "Pa+Pb" (i.e., Db<Pa+Pb).

If the trenches 111, 121, and 131 are shallow, the isolation performance with respect to the photoelectric conversion portions 101, 102, and 103 will decrease, and if the trenches 111, 121, and 131 have wide widths, the sensitivities of the photoelectric conversion portions 101, 102, and 103 will decrease. Thus, it is desirable that at least any one or both of the conditions "Da>Wa" and "Db>Wb" be satisfied, To increase the above-described distance Fib, it is desirable that the conditions "Da>Db" and "Dc>Db" be satisfied. It is also desirable that the conditions "Wa>Wb" and "Wc>Wb" be satisfied. Reducing the width of the trench 1.21 enables the silicon compound film 300 arranged inside the trench 121 to be reduced (or eliminated). Desirably, the width Wb of the trench 121 be less than half the widths Wa and Wc of the trenches 111 and 131 (i.e., "Wa/2>Wb" "Wc/2>Wb"). In other words, it is desirable that the widths Wa and Wc of the trenches 111 and 131 be greater than twice the width Wb of the trench 121 ("Wa>2×Wb", "Wc>2×Wb"). It is also desirable that the widths Wa and Wc of the trenches 111 and 131 be greater than three times the width Wb of the trench 121 ("Wa>3×Wb", "Wc>3×Wb"). By increasing a difference between the width Wb of the trench 121 and the widths Wa and Wc of the trenches 111 and 131 to that extent, the improvement of the sensitivity, the effect brought by the distance Hb being increased, becomes more noticeable.

In consideration of the characteristics of each of the isolation portions 110 and 130 and those of the isolation portion 120, it is desirable that the aspect ratio of the trench 121 be different from the aspect ratio of each of the trenches 111 and 131. Desirably, the aspect ratio Db/Wb of the depth to the width of the trench 121 be greater than the aspect ratios Da/Wa of the depth to the width of the trench 111 and Dc/Wc of the depth to the width of the trench 131 (i.e., Da/Wa<Db/Wb, Dc/Wc<Db/Wb). The aspect ratio Db/Wb of the trench 121 may be 10 or more.

FIG. 2 further illustrates a thickness Tm of the metal compound film 200 and a thickness Ts of the silicon compound film 300 on the back face 1001. The thickness Tm may be 5 to 150 nm, and the thickness Ts may be 50 to 200 nm. In the present exemplary embodiment, since only the metal compound film 200 exists in the area between the silicon compound film 300 and the semiconductor layer 100, the distance Hd matches the thickness Tm. However, the distance Hd is different from the thickness Tm if another layer exists in the area between the silicon compound film 300 and the metal compound film 200 or the area between the metal compound film 200 and the semiconductor layer 100.

In order to suitably arrange the metal compound film 200 inside the trenches 111 and 131, it is desirable that the thickness Tm of the metal compound film 200 be smaller than the widths Wa and Wc of the trenches 111 and 131 (Tm<Wa, Tm<Wc). In order to suitably arrange the silicon compound film 300 inside the trenches 111 and 131, it is desirable that the thickness Ts of the silicon compound film 300 be smaller than the widths Wa and Wc of the trenches 11.11 and 131 (Ts<Wa, Ts<Wc). In order to suitably arrange the silicon compound film 300 inside the trenches 111 and 131, it is desirable that the thickness Tm of the metal compound film 200 be thinner than the thickness Ts of the silicon compound film 300 (Tm<Ts). The metal compound film 200 is arranged on both side faces of the trenches 111 and 131, and the metal compound film 200 on the side faces can be approximated with the thickness Tm. The condition for suitably arranging the metal compound film 200 and the silicon compound film 300 inside the trench 111 having the widths Wa is then "2×Tm<Wa". The same applies to width "Wc". The condition for arranging the metal compound film 200 inside the trench 121 having the width Wb and suitably arranging the silicon compound film 300 is "Wb≤2×Tm". In this way, it is desirable that the condition "Wb≤2×Tm<Wa" be satisfied. It is also desirable that the condition "2×Tm<Wa−Wb" be satisfied. This is a formula derived from the above-described condition "2×Hd<Wa−Wb" with the thickness Tm made equal to the distance Hd (Tm=Hd). The widths Wa and Wc of the trenches 111 and 131, respectively, may be wider than a width of a trench necessary when the metal compound film 200 having the thickness Tm and the silicon compound film 300 having the thickness Ts are formed on both side faces of the trenches 111 and 131. In other words, the widths Wa and Wc may satisfy the conditions "2×Tm+2×Ts<Wa" and "2×Tm+2×Ts<Wc", respectively. Sufficiently increasing the widths Wa and Wc in this way suppresses generation of a gap in the trenches 111 and 131.

The typical relationship can be expressed as "Tm=Hd<Ts<Wb<Wa=Wc«P1=P2<Db<Hd<Da=Dc".

The metal compound film 200 is a single-layered or multi-layered metal compound film. A metal compound layer that is included in the metal compound film 200 is any one of a metal oxide layer, a metal nitride layer, and a metal carbide layer. The metal oxide layer is used as the metal compound layer, desirably, because the metal oxide layer has light transmissivity higher than that of the metal nitride layer and that of the metal carbide layer, with respect to the same metal. The metal compound film 200 according to the present exemplary embodiment is a multi-layered film including a metal compound layer 220 and a metal compound layer 210 lying between the metal compound layer 220 and the semiconductor layer 100. The thickness Tm of the metal compound film 200 is a sum of the thickness of the metal compound layer 220 and the thickness of the metal compound layer 210. The metal compound layer 220 is, for example, a tantalum oxide layer, a titanium oxide layer, a zirconium oxide layer, a niobium oxide layer, or a vanadium oxide layer. The metal compound layer 210 is, for example, an aluminum oxide layer or a hafnium oxide layer. It is desirable that the thickness of the metal compound layer 210 be thinner than the thickness of the metal compound layer 220. The metal compound layer 210 may function as a charge fixing layer for fixing a non-signal charge of the semiconductor layer 100. The metal compound layer 220 may function as an antireflection layer of light incident on the semiconductor layer 100.

The refractive index of the aluminum oxide ($Al_2O_3$) layer is 1.7 to 1.9, or typically, 1.77. The refractive index of the hafnium oxide ($HfO_2$) layer is 1.8 to 2.0, or typically, 1.91. The refractive index of the tantalum oxide ($Ta_2O_5$) layer is 2.0 to 2.2, or typically, 2.14. The refractive index of the zirconium oxide ($ZrO_2$) layer is 2.1 to 2.3, or typically, 2.21. The refractive index of the vanadium oxide ($V_2O_5$) layer is 2.2 to 2.4, or typically, 2.30. The refractive index of the niobium oxide ($Nb_2O_5$) layer is 2.2 to 2.4, or typically, 2.33. The refractive index of the titanium oxide ($TiO_2$) layer is 2.3 to 2.5, or typically, 2.39.

In a case where the semiconductor layer 100 is a silicon layer and photoelectrically converts visible light, the metal compound film 200 desirably has the following structure: the metal compound layer 210 being an aluminum oxide ($Al_2O_3$) layer having the thickness of 5 to 20 nm; and the metal compound layer 220 being a tantalum oxide ($Ta_2O_5$) layer having the thickness of 25 to 100 nm, for example.

The sensitivity of the photoelectric conversion portions 102 and 103 can be improved by increasing the refractive index of the layer at the center (intermediate between both side faces) of the trench 121 at the inlet portion thereof as much as possible. The inlet portion of the trench 121 is defined by a plane including the back face 1001 as a main face. It is desirable that a refractive index of a layer at the center (intermediate between both side faces) of the trench 121 in the plane including the back face 1001 be greater than 1.41, or desirably, 1.6 or more. Furthermore, it is desirable that the refractive index of the layer positioned at the center (intermediate between both side faces) of the trench 121 in the plane including the back face 1001 be greater than 1.91, or desirably, 2.0 or more. In the plane including the back face 1001, the layer at the center (intermediate between both side faces) of the trench 121 may satisfy these conditions. The refractive index of the layer at the center of the trench 121 is 1.6 or more in a case where the layer at the center thereof is a silicon nitride film or a silicon carbide film. Alternatively, the refractive index of the layer positioned at the center of the trench 121 is 1.91 or more in a case where the layer at the center thereof is a zirconium oxide layer, a vanadium oxide layer, a niobium oxide layer, or a titanium oxide layer.

In the present exemplary embodiment, a back-face illumination type photoelectric conversion apparatus in which the back face 1001 serving as the light receiving face has been described. The technique described in the present exemplary embodiment is also applicable to a front-face illumination type photoelectric conversion apparatus in which the front face 1002 serving as the light receiving face. In such a case, a trench is formed from the front face 1002 on which a transistor is formed, and a metal compound film and/or a silicon compound film are arranged inside the trench formed in the front face 1002 side.

Figure 3:
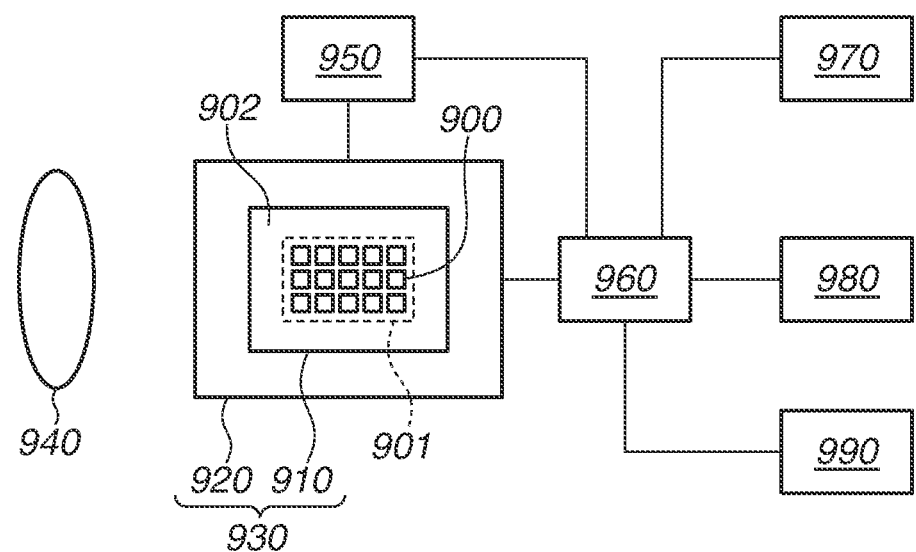
FIG. 3 is a schematic section diagram illustrating the photoelectric conversion apparatus.

FIG. 3 is a schematic diagram illustrating equipment 9191 having the photoelectric conversion apparatus 930. The equipment 9191 further includes at least any of an optical apparatus 940, a control apparatus 950, a processing apparatus 960, a storage apparatus 970, a display apparatus 980, and a mechanical apparatus 990 in addition to the photoelectric conversion apparatus 930. The optical system 940 is associated with the photoelectric conversion apparatus 930 and forms an image on the photoelectric conversion apparatus 930. The control apparatus 950 controls the photoelectric conversion apparatus 930. The processing apparatus 960 processes a signal output from the photoelectric conversion apparatus 930. The storage apparatus 970 stores information acquired by the photoelectric conversion apparatus 930. The display apparatus 980 displays information acquired by the photoelectric conversion apparatus 930. The mechanical apparatus 990 operates based on information acquired by the photoelectric conversion apparatus 930. The mechanical apparatus 990 may be a moving apparatus that moves the photoelectric conversion apparatus 930 inside the equipment 9191 or together with the equipment 9191. A vibration isolation function (i.e., image stabilizer function) can be realized by the photoelectric conversion apparatus 930 being moved inside the equipment 9191.

Although the photoelectric conversion apparatus 930 may include an electronic device 910 and a mounting member 920, the mounting member 920 may not be included. The electronic device 910 is a semiconductor device having a semiconductor layer. The electronic device 910 includes a photoelectric conversion area 901 where photoelectric conversion portions are arrayed, and a peripheral circuit area 902 where a peripheral circuit (not illustrated) is arrayed. The configurations of the isolation portions 110, 120, 130 according to the present exemplary embodiment can be applied to the photoelectric conversion area 901 in the equipment 9191. The peripheral circuit includes the driving circuit and the AD conversion circuit described above, a digital signal processing circuit, and a control circuit. Although the photoelectric conversion area 901 and the peripheral circuit area 902 may be arranged on the same semiconductor layer, the photoelectric conversion area 901 and the peripheral circuit area 902 may be arranged on mutually-laminated separate semiconductor layers (semiconductor substrates) in the present exemplary embodiment.

The mounting member 920 includes a ceramic package, a plastic package, a printed wiring board, a flexible cable, solder, and wire bonding. The optical system 940 may be a lens, a shutter, a filter, or a mirror. The control apparatus 950 may be a semiconductor device, such as an application specific integrated circuit (ASIC). The processing apparatus 960 may be a semiconductor device, such as a central processing unit (CPU) or an application specific integrated circuit (ASIC) which constitutes, for example, an analog frontend (AFE) or a digital frontend (DFE). The display apparatus 980 may be an electroluminescence display apparatus or a liquid crystal display apparatus. The storage apparatus 970 is a volatile memory, such as a static random access memory (SRAM) and a dynamic RAM (DRAM), or a non-volatile memory, such as a flash memory and a hard disk drive, e.g., a magnetic device or a semiconductor device. The mechanical apparatus 990 includes a movable unit or a driving unit, such as a motorand an engine.

The equipment 9191 illustrated in FIG. 3 may be an electronic equipment, such as an information terminal having an imaging function (e.g., a smartphone or a wearable terminal) or a camera (e.g., an interchangeable-lens camera, a compact camera, a video camera, or a monitoring camera). The mechanical device 990 included in a camera drives a component of the optical system 940 in order to perform zooming, focusing, or shutter operation. The equipment 9191 may be a transportation equipment (moving body), such as a vehicle, a ship, a flight vehicle, or a space satellite. The mechanical apparatus 990 included in a transportation equipment can be used as a moving apparatus. The equipment 9191 serving as a transportation equipment is suitable for transporting the photoelectric conversion apparatus 930 or assisting and/or automating an operation (driving operation) through an imaging function. The processing apparatus 960 for assisting and/or automating the operation (driving operation) can perform processing for operating the mechanical apparatus 990 serving as a moving apparatus based on the information acquired by the photoelectric conversion apparatus 930. The equipment 9191 may be an analytical equipment or a medical equipment.

The photoelectric conversion apparatus 930 according to the present exemplary embodiment can provide high value to its designer, a manufacturer, a distributor, a purchaser, and/or a user. Thus, the equipment 9191 can be also upgraded if the photoelectric conversion apparatus 930 is mounted on the equipment 9191. Thus, when the equipment 9191 is to be manufactured and distributed, mounting the photoelectric conversion apparatus 930 according to the present exemplary embodiment on the equipment 9191 is advantageous for upgrading the equipment 9191.

A method for manufacturing the photoelectric conversion apparatus will be described with reference to FIGS. 4A to 4B and 5A to 5D.

Figure 4A:
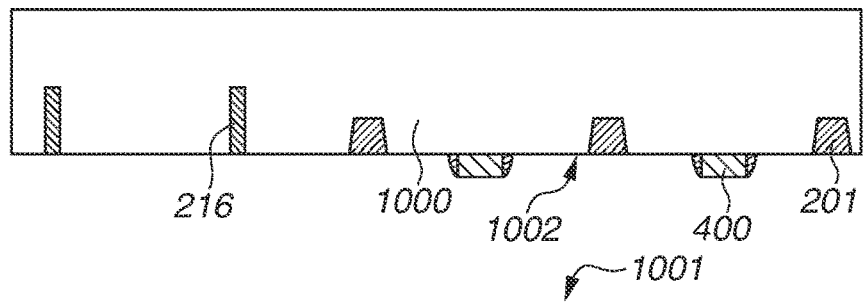
FIGS. 4A to 4G are schematic section diagrams illustrating a manufacturing method of the photoelectric conversion apparatus.

As illustrated in FIG. 4A, the semiconductor substrate 1000 on which photoelectric conversion portions, transistors including the gate electrode 400, and a wiring structure (not illustrated) are formed is vertically flipped and joined to a supporting substrate (not illustrated). The supporting substrate may be the semiconductor substrate 600. The semiconductor substrate 1000 includes an element isolation portion 201 having a shallow trench isolation (STI) structure on the front face 1002 side. The semiconductor substrate 1000 further includes, on the front face 1002 side, an insulation area 216 where an insulation body is embedded in a trench that is deeper than the element isolation portion 201.

Figure 4B:
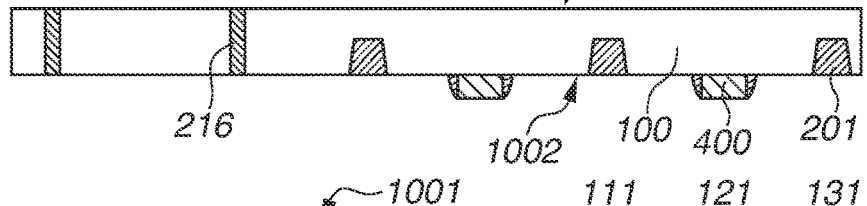

Next, as illustrated in FIG. 4B, the semiconductor substrate 1000 is thinned from a side opposite to the front face 1002 down to a thickness of approximately several-ten to several um, until the insulation area 216 penetrates the semiconductor substrate 1000. In this way, the semiconductor layer 100 having the front face 1002 and the back face 1001 is formed. Examples of methods for thinning includes back grinding, chemical mechanical polishing, and etching.

Figure 4C:
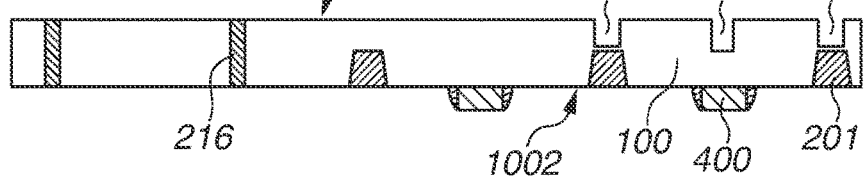

Subsequently, as illustrated in FIG. 4C, the trenches 111 and 131 for isolating a pixel from the other pixels and the trench 121 for isolating a part of a pixel from the other part of the pixel are formed on the semiconductor layer 100 through etching from a side of the back face 1001. In a case where the trenches 111, 121, and 131 are formed through dry etching, adopting etching conditions which bring a microloading effect enables the formation of the thin and shallow trench 121 and the thick and deep trenches 111 and 131. In FIG. 4C, the trenches 111 and 131 are formed in such a manner that the trenches 111 and 131 each overlap with the element isolation portion 201. The trenches 111 and 131 may be formed in such a manner that the trenches 111 and 131 each reach the element isolation portion 201.

Figure 4D:
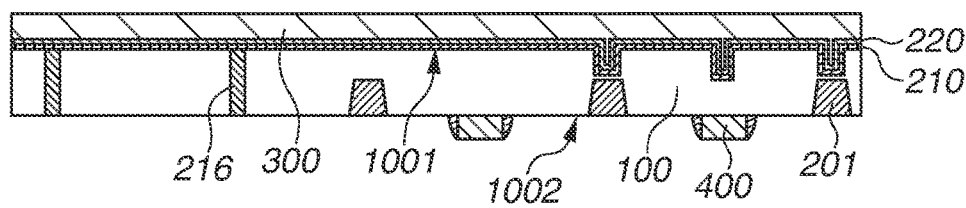

Subsequently, as illustrated in FIG. 4D, the metal compound layers 210 and 220 and the silicon compound film 300 are formed. An atomic layer deposition (ALD) method may be employed as a film forming method for the metal compound layer 210. By employing the ALD method, the metal compound layer 210 having a uniform thickness can be formed on a trench having a large aspect ratio. The metal compound layer 210 is, for example, a hafnium oxide layer, an aluminum oxide layer, a zirconium oxide layer, a niobium oxide layer, a titanium oxide layer, or a vanadium oxide layer.

Examples of film forming methods for the metal compound layer 220 include the ALD method, the physical vapor deposition (PVD) method, and the chemical vacuum deposition (CVD) method. The metal compound layer 220 may be a tantalum oxide layer or a titanium oxide layer.

The silicon compound film 300 can be optionally selected from among e materials generally used for a semiconductor apparatus. For example, the silicon compound film 300 may be a silicon oxide film, a silicon nitride film, a silicon oxynitride film, a carbon-containing silicon oxide film, or a fluorine-containing silicon oxide film. A layer structure of the silicon compound film 300 may be a single layer structure including one material, or a laminated structure including a plurality of materials.

The film embedded in the trenches 111, 131, and 121 is determined based on the widths of the trenches 111, 131, and 121, respectively, and film thicknesses of the metal compound film 200 (metal compound layers 210 and 220) and the silicon compound film 300.

The width of the trench 121 is reduced to a width narrower than the widths of the trenches 111 and 131, and the metal compound layers 210 and 220 and the silicon compound film 300 may be formed. Having done that, only the metal compound layers 210 and 220 are embedded in the trench 121, and the metal compound layers 210 and 220 and the silicon compound film 300 are embedded in the trenches 111 and 131. Alternatively, only the metal compound layer 210 is embedded in the trench 121, and the metal compound layers 210 and 220 and the silicon compound film 300 are embedded in the trenches 111 and 131. Having done that, the silicon compound film 300 is not embedded in the trench 121 that is embedded with the metal compound layers 210 and 220 or embedded only with the metal compound layer 210, so that loss of light caused by the isolation portion 120 can be reduced. In the present exemplary embodiment, it is desirable that a film that is to be lastly embedded in the trench 121 have a refractive index greater than 1.91. The number of films to be embedded can be changed by the film thickness formed on the trenches 111, 121, and 131 being adjusted, and a combination of the width, the film thickness, and the number of layers can be selected optionally. A layer at the center (intermediate between both side faces) of the trench 121 in the inlet portion thereof can be the layer that is to be lastly embedded in the trench 121.

In the present exemplary embodiment, it is desirable that the layer embedded in the trench 121 have a refractive index greater than 1.41. It is also desirable that the layer lastly embedded in the trench 121 have the refractive index greater than 1.91. Examples of layers having the refractive indexes greater than 1.91 include a zirconium oxide layer, a niobium oxide layer, a titanium oxide layer, and a tantalum oxide layer.

Figure 4E:
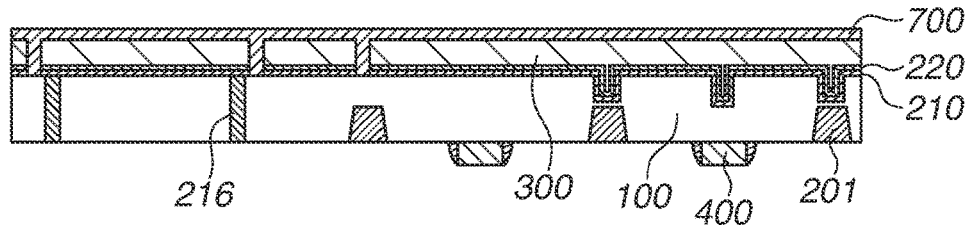

Next, a trench in which a metallic structure is embedded is formed on the silicon compound film 300. As illustrated in FIG. 4E, a conductive film 700 is formed on the entire face of the silicon compound film 300. At this time, trenches of the silicon compound film 300 are embedded with the conductive film 700. The conductive film 700 may be a tungsten film, an aluminum film, or a copper film.

Figure 4F:
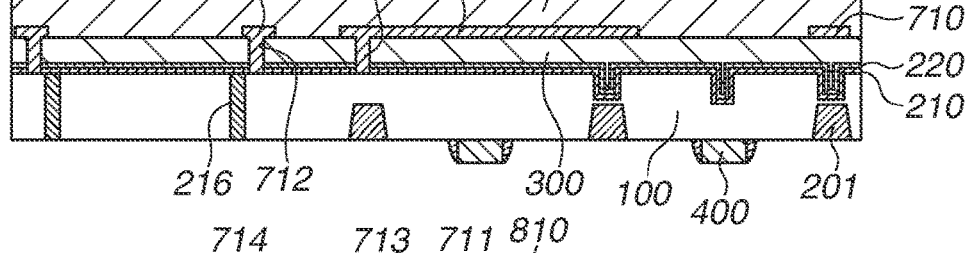

Next, patterning is performed on the conductive film 700 as illustrated in FIG. 4F. The patterning is performed by photolithography and etching. The patterning forms a part of the conductive film 700 into the light shielding members 710 and 711, and forms another part thereof into a guard ring 714. The light shielding member 711 serves as a light shielding body for an optical black pixel and a peripheral circuit. Concurrently with formation of the light shielding member 710 and the guard ring 714, a via plug 713 and a guard ring 712 for connecting the light shielding member 710 and the guard ring 714 to the semiconductor layer 100 are formed on inner portions of trenches on the silicon compound film 300. The guard rings 712 and 714 are arranged to surround an outer side of the insulation area 216 in a planar view of the back face 1001.

Next, the insulation film 810 is formed as illustrated in FIG. 4F. The insulation film 810 can be optionally selected from among the materials generally used for a semiconductor apparatus. Examples of such materials include a silicon oxide film, a silicon nitride film, a silicon oxynitride film, a carbon-containing silicon oxide film, and a fluorine-containing silicon oxide film. The layer structure of the insulation film 810 may be a single layer structure including one material, or a laminated structure including a plurality of materials.

Figure 4G:
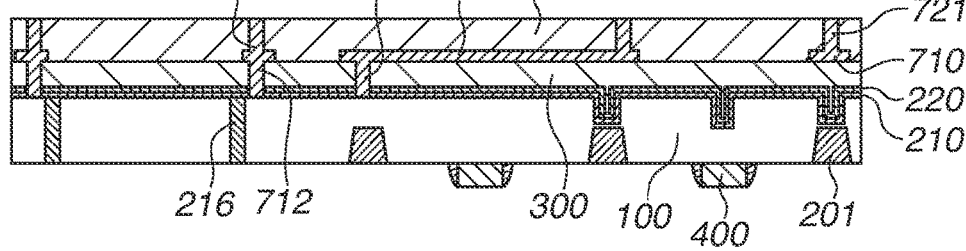

Next, a trench is formed through etching of the surface of the insulation film 810. Subsequently, a conductive body is formed through the PVD method or the CVD method, and the trench is embedded with the conductive body. Thereafter, the conductive body is removed from the surface of the substrate through a chemical mechanical polishing method or an etch-back method. In this way, a light shielding wall 721 is formed on the insulation film 810 as illustrated in FIG. 4G. Further, the number of layers of the metal film can be selected optionally.

Figure 5A:
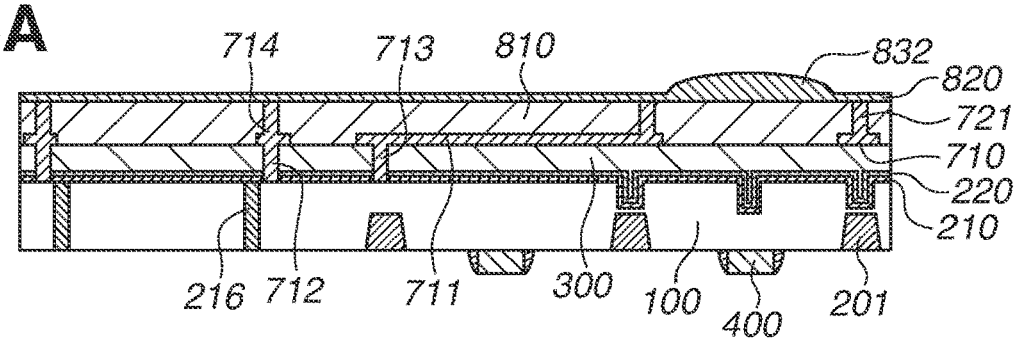
FIGS. 5A to 5D are schematic section diagrams illustrating a manufacturing method of the photoelectric conversion apparatus.

Next, as illustrated in FIG. 5A, the dielectric film 820 is formed on the insulation film 810. The dielectric film 820 is then processed through, for example, photolithography and etching, forming the interlayer lens 832 on the dielectric film 820. The dielectric film 820 can be optionally selected from among the materials generally used for a semiconductor apparatus. Examples of such materials include a silicon oxide film, a silicon nitride film, a silicon oxynitride film, a carbon-containing silicon oxide film, and a fluorine-containing silicon oxide film. A layer structure of the dielectric film 820 may be a single layer structure including one material or a laminated structure including a plurality of materials.

Figure 5B:
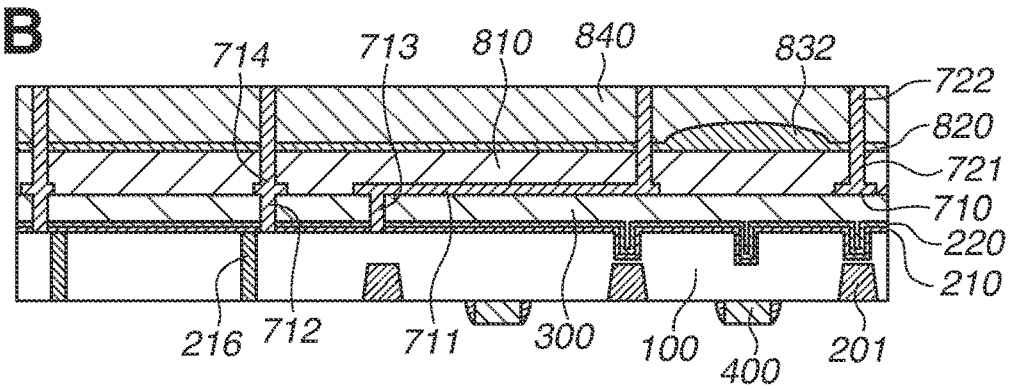

Next, the insulation film 840 is formed, and a trench is formed through etching of the surface of the insulation film 840. The trench is embedded with the conductive body on the entire surface of the substrate through the PVD method or the CVD method. The conductive body is removed from the surface of the substrate through the chemical mechanical polishing method or the etch-back method, thus forming the light shielding wall 722 in the insulation film 840 as illustrated in FIG. 5B. The light shielding walls 721 and 722 are in contact with each other, and function as the light shielding wall 720 illustrated in FIG. 1. The insulation film 840 can be optionally selected from among the materials generally used for a semiconductor apparatus. Examples of such materials include a silicon oxide film, a silicon nitride film, a silicon oxynitride film, a carbon-containing silicon oxide film, and a fluorine-containing silicon oxide film. A layer structure of the insulation film 840 may be a single layer structure including one material, or a laminated structure including a plurality of materials. Further, tungsten can be used as a material of the light shielding wall 722.

Figure 5C:
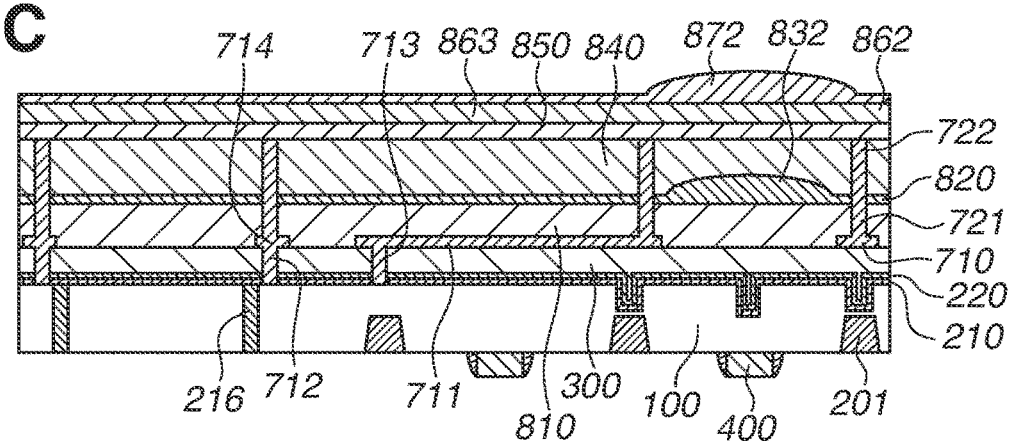

Next, as illustrated in FIG. 5C, the planarization film 850, the color filters 862 and 863, and the microlens 872 are formed. The blue color filter 863 covers the light shielding member 711. The planarization film 850 can be optionally selected from among the materials generally used for a semiconductor apparatus. Examples of such materials include a silicon oxide film, a silicon nitride film, a silicon oxynitride film, a carbon-containing silicon oxide film, a fluorine-containing silicon oxide film, and a resin film. A layer structure of the planarization film 850 may be a single layer structure including one material or a laminated structure including a plurality of materials.

Figure 5D:
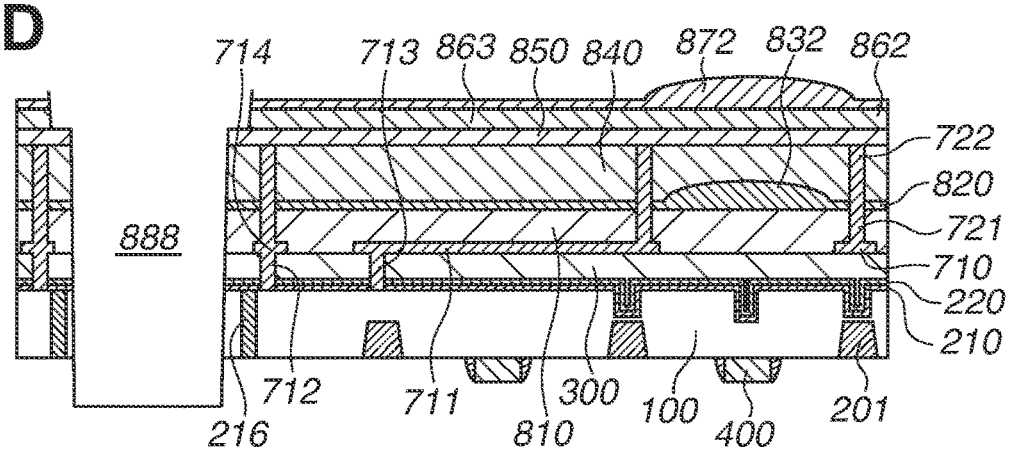

Next, as illustrated in FIG. 5D, an opening 888 is formed on the semiconductor layer 100 through dry etching. A pad (not illustrated) including aluminum, which is previously arranged on the wiring structure 440 or 540 illustrated in FIG. 1, is exposed on the bottom of the opening 888. Thereafter, a wafer including the semiconductor layer 100 is diced into chips, and each of the chips is connected to the pad via the opening 888 through wire-bonding processing and packaging processing, so that the photoelectric conversion apparatus can be acquired.

The exemplary embodiments included in the present disclosure include not only items described in writing but also include all items that can be implied from the writing and the accompanying drawings. The constituent elements described in the present exemplary embodiments can be added, deleted, or replaced within a range which does not depart from the technical spirit of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-170835, filed Sep. 12, 2018, which is hereby incorporated by reference herein in its entirety.

What is claimed is:

1. A photoelectric conversion apparatus comprising:
a semiconductor layer including a plurality of photoelectric conversion portions and a main face forming respective light receiving faces of the plurality of photoelectric conversion portions,
wherein the plurality of photoelectric conversion portions includes a first photoelectric conversion portion, a second photoelectric conversion portion and a third photoelectric conversion portion,
wherein the semiconductor layer has a first trench positioned between the first photoelectric conversion portion and the second photoelectric conversion portion, a second trench positioned between the second photoelectric conversion portion and the third photoelectric conversion portion,
wherein the first trench and the second trench each continuously extend on the main face,
wherein a silicon compound film that is any one of a silicon oxide film, a silicon nitride film, and a silicon carbide film and a metal compound film lying between the silicon compound film and the semiconductor layer are provided above the main face,
wherein the silicon compound film and the metal compound film extend into the first trench, wherein the metal compound film extends into the second trench, and wherein the following conditions are satisfied:

$Hd<Hb$; and $Wa-2\times Hd>Wb$, where a distance from a bottom of the second trench to the silicon compound film is expressed as Hb, a distance from the main face to the silicon compound film is expressed as Hd, a width of the first trench is expressed as Wa, and a width of the second trench is expressed as Wb.

2. The photoelectric conversion apparatus according to claim 1, wherein the following conditions are satisfied:

$Da>Wa$; and $Db>Wb$, where a depth of the first trench is expressed as Da, and a depth of the second trench is expressed as Db.

3. The photoelectric conversion apparatus according to claim 2, wherein the following condition is satisfied:

$Da-Db>Hd$.

4. The photoelectric conversion apparatus according to claim 2, wherein the following condition is satisfied:

$Db<Hb$.

5. The photoelectric conversion apparatus according to claim 2, wherein the plurality of photoelectric conversion portions includes a fourth photoelectric conversion portion, the semiconductor layer has a third trench positioned between the third photoelectric conversion portion and the fourth photoelectric conversion portion, and wherein the following condition is satisfied:

$Db<Pa+Pb$, where a distance between the first trench and the second trench is expressed as Pa, and a distance between the second trench and the third trench is expressed as Pb.

6. The photoelectric conversion apparatus according to claim 2, wherein the following condition is satisfied:

$Db<Da$.

7. The photoelectric conversion apparatus according to claim wherein the following condition is satisfied:

$Da/Wa<Db/Wb$.

8. The photoelectric conversion apparatus according to claim 1, wherein the following condition is satisfied:

$Wa>2\times Wb"$.

9. The photoelectric conversion apparatus according to claim 1, wherein the following conditions are satisfied:

$Tm<Wa$; and $Ts<Wa$, where a thickness of the metal compound film above the main face is expressed as Tm and a thickness of the silicon compound film above the main face is expressed as Ts.

10. The photoelectric conversion apparatus according to claim 9, wherein the following condition is satisfied:

$Tm<Ts$.

11. The photoelectric conversion apparatus according to claim 9, wherein the following condition is satisfied:

$Wb\leq 2\times Tm<Wa$.

12. The photoelectric conversion apparatus according to claim 9, wherein the following condition is satisfied:

$2>Tm<Wa-Wb$.

13. The photoelectric conversion apparatus according to claim 9, wherein the following condition is satisfied:

$2\times Tm+2\times Ts<Wa$.

14. The photoelectric conversion apparatus according to claim 1, wherein the silicon compound film includes a silicon oxide film, and wherein the metal compound film includes a multi-layered film including a first metal oxide layer and a second metal oxide layer lying between the first metal oxide layer and the semiconductor layer.

15. The photoelectric conversion apparatus according to claim 14, wherein the first metal oxide layer is a tantalum oxide layer, a titanium oxide layer, or a zirconium oxide layer.

16. The photoelectric conversion apparatus according to claim 14, wherein the second metal oxide layer is an aluminum oxide layer or a hafnium oxide layer.

17. The photoelectric conversion apparatus according to claim 14, wherein a thickness of the second metal oxide layer is smaller than a thickness of the first metal oxide layer.

18. The photoelectric conversion apparatus according to claim 1, wherein a lens array including a plurality of lenses is arranged over the main face, and wherein one lens from among the plurality of lenses is arranged over the second photoelectric conversion portion and the third photoelectric conversion portion.

19. The photoelectric conversion apparatus according to claim 18, wherein another lens array including a plurality of lenses is arranged between the lens array and the semiconductor layer.

20. Equipment including the photoelectric conversion apparatus according to claim 1, further comprising at least any one of:

an optical apparatus associated with the photoelectric conversion apparatus;

a control apparatus configured to control the photoelectric conversion apparatus;

a processing apparatus configured to process a signal output from the photoelectric conversion apparatus;

a display apparatus configured to display information acquired by the photoelectric conversion apparatus;

a storage apparatus configured to store information acquired by the photoelectric conversion apparatus; and a mechanical apparatus configured to move the photoelectric conversion apparatus based on information acquired by the photoelectric conversion apparatus.

* * * * *